US012604786B2

(12) United States Patent

Gupta et al.

(10) Patent No.: US 12,604,786 B2
(45) Date of Patent: Apr. 14, 2026

(54) METHOD OF ATOMIC DIFFUSION HYBRID BONDING AND APPARATUS MADE FROM SAME

(71) Applicant: Intel Corporation, Santa Clara, CA (US)

(72) Inventors: Jay Prakash Gupta, Hillsboro, OR (US); Souvik Ghosh, Kolkata (IN); Kimin Jun, Portland, OR (US); Bhupendra Kumar, Beaverton, OR (US); Shashi Vyas, Euclid, OH (US); Anup Pancholi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 854 days.

(21) Appl. No.: 17/699,024

(22) Filed: Mar. 18, 2022

(65) Prior Publication Data

US 2023/0299040 A1 Sep. 21, 2023

(51) Int. Cl.
H01L 23/00 (2006.01)

(52) U.S. Cl.
CPC ............. H01L 24/80 (2013.01); H01L 24/03 (2013.01); H01L 24/05 (2013.01); H01L 24/08 (2013.01); *H01L 2224/0345* (2013.01); *H01L 2224/03849* (2013.01); *H01L 2224/05147* (2013.01); *H01L 2224/05187* (2013.01); *H01L 2224/05666* (2013.01); *H01L 2224/05687* (2013.01); *H01L 2224/08147* (2013.01); *H01L 2224/8009* (2013.01); *H01L 2224/80203* (2013.01);

(Continued)

(58) Field of Classification Search
None
See application file for complete search history.

(56) References Cited

U.S. PATENT DOCUMENTS

| | | | | |
|---|---|---|---|---|
| 6,756,305 B1 * | 6/2004 | Conn | ...................... | H01L 24/11 257/E23.021 |
| 7,402,509 B2 * | 7/2008 | Kobrinsky | .............. | H01L 24/11 257/E21.705 |

(Continued)

FOREIGN PATENT DOCUMENTS

| | | | | |
|---|---|---|---|---|
| DE | 102020120137 B4 * | 6/2022 | ......... | H01L 21/4853 |
| JP | 2016021497 A * | 2/2016 | | |

(Continued)

OTHER PUBLICATIONS

Morgan, A. E., et al. "Interactions of Thin Ti Films with Si, SiO2, Si3N4, and SiOxNy under Rapid Thermal Annealing." Journal of Applied Physics, vol. 64, No. 1, Jul. 1988, pp. 344-353. aip.scitation. org (Atypon), https://doi.org/10.1063/1.341434.

(Continued)

*Primary Examiner* — Michael Lebentritt
(74) *Attorney, Agent, or Firm* — Alliance IP, LLC

(57) ABSTRACT

A microelectronic assembly and a method of forming same. The assembly includes: first and second microelectronic structures; and an interface layer between the two microelectronic structures including dielectric portions in registration with dielectric layers of each of the microelectronic structures, and electrically conductive portions in registration with electrically conductive structures of each of the microelectronic structures, wherein the dielectric portions include an oxide of a metal, and the electrically conductive portions include the metal.

25 Claims, 5 Drawing Sheets

(52) U.S. Cl.
CPC ................. *H01L 2224/8083* (2013.01); *H01L*
*2224/80895* (2013.01); *H01L 2224/80896*
(2013.01); *H01L 2224/80948* (2013.01); *H01L*
*2924/35121* (2013.01)

(56) References Cited

U.S. PATENT DOCUMENTS

| | | | | |
|---|---|---|---|---|
| 8,809,123 | B2 * | 8/2014 | Liu | ......................... H01L 24/05 |
| | | | | 438/455 |
| 9,832,886 | B2 * | 11/2017 | Kumaki | .............. H01L 23/5226 |
| 11,658,173 | B2 * | 5/2023 | Uzoh | .................. H01L 25/0657 |
| | | | | 257/787 |
| 11,894,326 | B2 * | 2/2024 | Katkar | .................... H01L 25/50 |
| 2018/0182666 | A1 * | 6/2018 | Uzoh | ............... H01L 21/76868 |
| 2019/0319007 | A1 * | 10/2019 | Uzoh | ...................... H01L 24/30 |
| 2019/0326252 | A1 * | 10/2019 | Mandalapu | ............. H01L 24/98 |
| 2019/0385977 | A1 * | 12/2019 | Elsherbini | ........... H01L 23/5389 |
| 2020/0013637 | A1 * | 1/2020 | Haba | ........................ H01L 24/97 |
| 2020/0091128 | A1 * | 3/2020 | Elsherbini | ........... H01L 23/5386 |
| 2020/0105692 | A1 * | 4/2020 | Katkar | .................... H01L 25/50 |
| 2022/0165692 | A1 * | 5/2022 | Uzoh | ...................... H01L 25/50 |
| 2023/0073026 | A1 * | 3/2023 | Elsherbini | ............... H01L 24/80 |
| 2023/0178513 | A1 * | 6/2023 | Jun | ......................... H01L 24/24 |
| | | | | 257/668 |
| 2023/0187264 | A1 * | 6/2023 | Uzoh | ............... H01L 21/32051 |
| | | | | 438/455 |
| 2023/0299049 | A1 * | 9/2023 | Deshpande | ........... H01L 23/481 |
| 2023/0411348 | A1 * | 12/2023 | Hanna | ................. H01L 23/5385 |
| 2024/0113005 | A1 * | 4/2024 | Ecton | ...................... H01L 24/05 |
| 2024/0186250 | A1 * | 6/2024 | Ecton | ...................... H01L 23/15 |
| 2024/0332231 | A1 * | 10/2024 | Uzoh | .................. H01L 25/0657 |

FOREIGN PATENT DOCUMENTS

| | | | | | |
|---|---|---|---|---|---|
| WO | WO-2017038713 | A1 | * | 3/2017 | ............... H05K 3/28 |
| WO | WO-2019132958 | A1 | * | 7/2019 | ............. G02B 6/125 |

OTHER PUBLICATIONS

Russell, S. W., et al. "Reaction Kinetics in the Ti/SiO2 System and Ti Thickness Dependence on Reaction Rate." Journal of Applied Physics, vol. 76, No. 1, Jul. 1994, pp. 257-263. aip.scitation.org (Atypon), https://doi.org/10.1063/1.357137.

* cited by examiner

Plasma Treatment/Dielectric Surface Modification to Increase Hydrophilicity

Ultra High
Vacuum
220

400

PROCESSOR UNIT
402

COMMUNICATION COMPONENT
412

MEMORY
404

BATTERY/POWER
414

DISPLAY DEVICE
406

GNSS DEVICE
418

AUDIO OUTPUT DEVICE
408

AUDIO INPUT DEVICE
424

AN OTHER OUTPUT DEVICE
410

AN OTHER INPUT DEVICE
420

ANTENNA 422

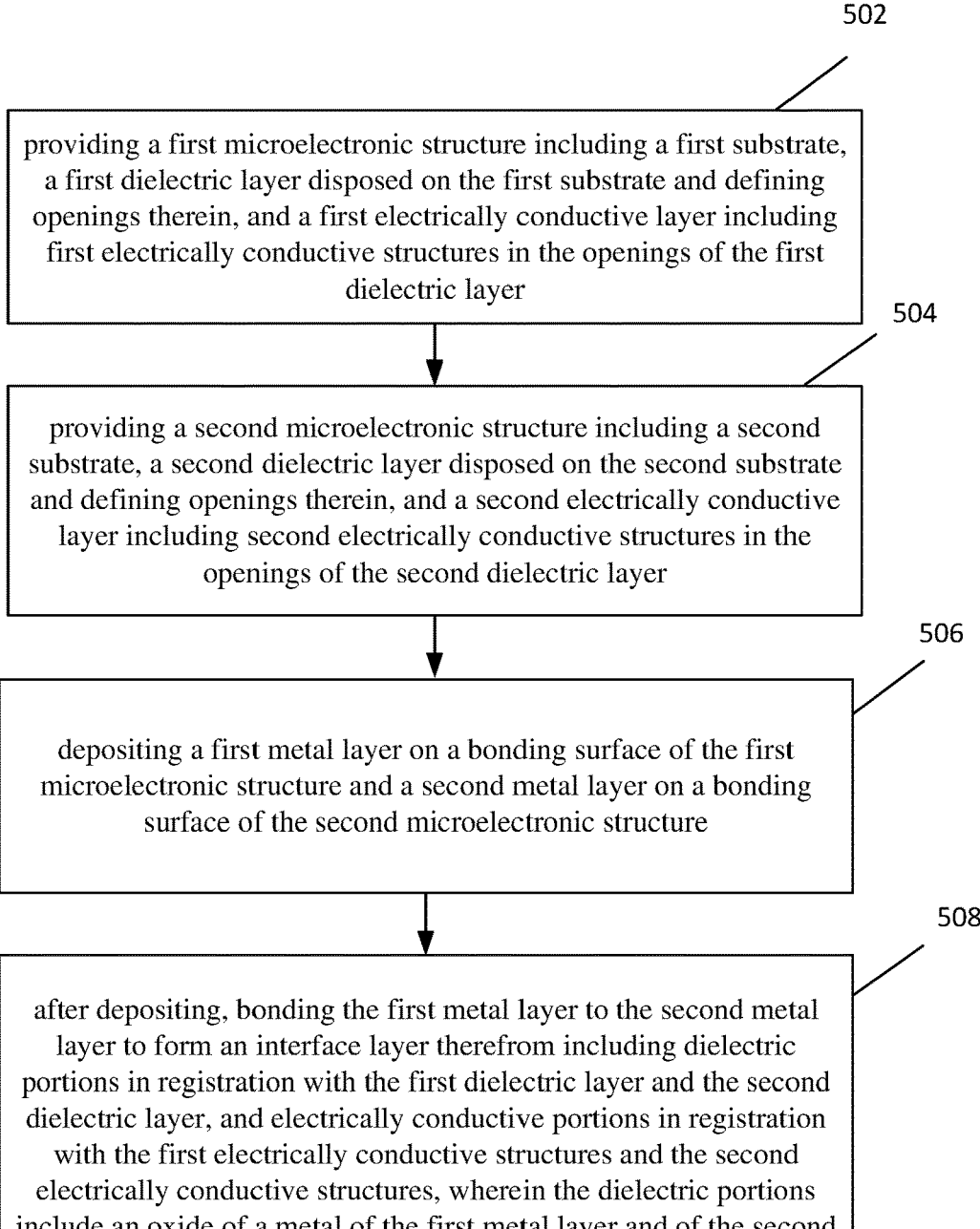

502 providing a first microelectronic structure including a first substrate, a first dielectric layer disposed on the first substrate and defining openings therein, and a first electrically conductive layer including first electrically conductive structures in the openings of the first dielectric layer

504 providing a second microelectronic structure including a second substrate, a second dielectric layer disposed on the second substrate and defining openings therein, and a second electrically conductive layer including second electrically conductive structures in the openings of the second dielectric layer

506 depositing a first metal layer on a bonding surface of the first microelectronic structure and a second metal layer on a bonding surface of the second microelectronic structure

508 after depositing, bonding the first metal layer to the second metal layer to form an interface layer therefrom including dielectric portions in registration with the first dielectric layer and the second dielectric layer, and electrically conductive portions in registration with the first electrically conductive structures and the second electrically conductive structures, wherein the dielectric portions include an oxide of a metal of the first metal layer and of the second metal layer, and the electrically conductive portions include the metal

FIG. 5

METHOD OF ATOMIC DIFFUSION HYBRID BONDING AND APPARATUS MADE FROM SAME

TECHNICAL FIELD

This disclosure relates generally to the hybrid bonding of microelectronic components.

BACKGROUND

Hybrid bonding involves bonding dielectrics (e.g. using dielectric to dielectric bonding) and also electrically conductive structures (e.g. using metal to metal bonding) for the coupling of microelectronic structures (such as wafer and/or dies) to one another. Hybrid bonding represents enabling technology that allows a furthering of Moore's law in both logic and memory applications. Leading semiconductor companies invest heavily in the field of hybrid bonding, and, for some commercially available memory products, already provide Cu to Cu bond pitches of about 1 um. Pitch scaling and bond integrity continue to remain important as the technology progresses.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5 is a flow chart of a process according to some embodiments.

DETAILED DESCRIPTION

Figures 1A, 1B, 1C, 1D:
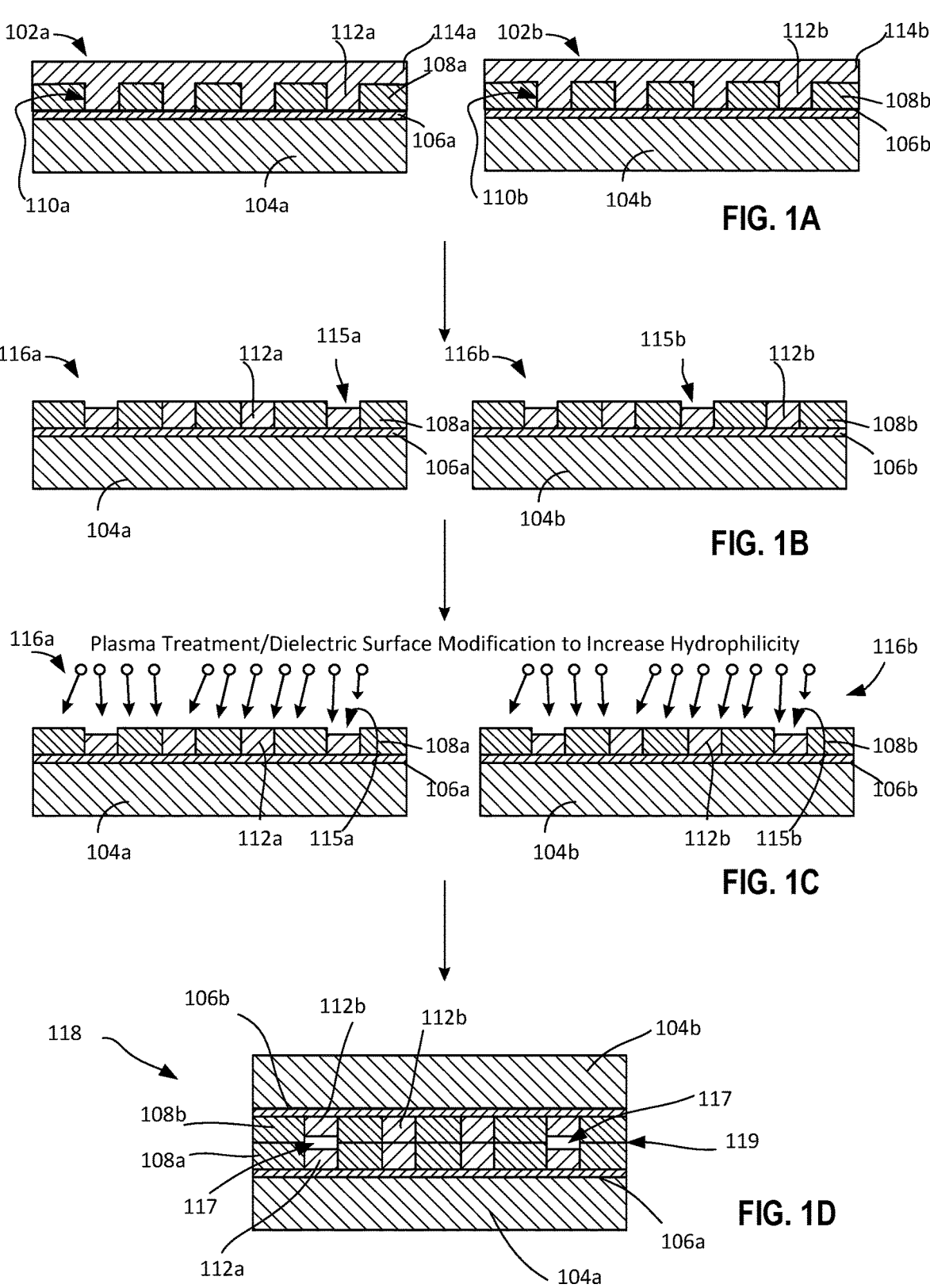
FIG. 1A is a cross sectional view of two microelectronic structures to be processed for hybrid bonding according to the state of the art.
FIG. 1B is a cross sectional view of two microelectronic components resulting from a polishing of the microelectronic structures of FIG. 1A, the polishing for hybrid bonding of the microelectronic components according to the state of the art.
FIG. 1C is a cross sectional view of the two microelectronic components of FIG. 1B undergoing a plasma treatment procedure for hybrid bonding of the microelectronic components of FIG. 1B according to the state of the art.
FIG. 1D is a cross sectional view of a microelectronic assembly including the two microelectronic components of FIG. 1C after plasma treatment procedure and during a hybrid bonding and anneal process according to the state of the art.

Some embodiments provide a hybrid bonding technique involves the use of atomic deposition bonding, where a very thin (e.g. about 1 nm to about 2 nm) layer of a metal is deposited on respective microelectronic structures in an ultra-high vacuum (UHV) environment (for example, is the vacuum regime characterized by pressures lower than about 100 nano Pascals). The metal deposition may then be followed by in-situ bonding, resulting in a robust bond strength. Post bond, the assembly thus formed may be subjected to a low temperature anneal to cause inter-metal diffusion of the deposited metal with the material of the electrically conductive structure, and to cause oxidation of the deposited metal, resulting in a desirable and strong bond strength of over about 1.5 J/m2. According to some embodiments, the deposited metal may include Ti, and a metal of the electrically conductive structures may include Cu.

Some embodiments aim to improve hybrid bonding by providing a hybrid bonding scheme that makes possible a reduction in the pitch of electrically conductive structures of hybrid bonded microelectronic structures, such microelectronic structures including dies or wafers. Some embodiments allow the fabrication of hybrid bonded microelectronic components with boosted performance and increased density. Some embodiments provide a hybrid bonding schemes that explores metals or dielectrics which enable pitch scaling without reliability penalties with meal electromigration.

By "electrically conductive structure," what is meant herein is any electrically conductive structure used in a microelectronic structure, such as conductive contacts, pads, traces, lines, interconnects or vias, by way of example. An "electrically conductive structure" as used herein may include an electrically conductive structure that is to provide direct electrical coupling between a first die or first wafer and a second die or second wafer, such as an electrically conductive contact structure.

In current hybrid bonding schemes (whether wafer-to-wafer or die-to-wafer), as bonding pitch between electrically conductive structures is reduced below 10 um (e.g. when the electrically conductive structures include Cu pads), electromigration of a metal used in the electrically conductive structures (it being understood that an electrically conductive structure according to embodiments may include one or more metals), for example electromigration of Cu, becomes an issue, resulting in device reliability issues, thus limiting the use of dielectric materials that can be used between the bonding Cu pads.

There are a few conditions that point to a desired quality of hybrid bonding: (1) a post bond strength (or "bond energy") as measured post bonding/post bond anneal that is greater than about 1.5 J/m2 (e.g. using the Mazara method) to enable reliable bond integrity during downstream processing without any wafer breakage or misalignment issues; and (2) an post bond metal electromigration from the electrically conductive structures to the dielectric materials that is either non-existent or negligible, and this in order to enable the fabrication of reliable devices by minimizing the possibility of shorts.

An example microelectronic component to be hybrid bonded to another may include a dielectric material such as SiO2 defining openings therein, and an electrically conductive metal, such as Cu, embedded in the openings. Such materials are desirable in allowing the achievement of bond energies of above about 1.5 J/m2 post bond and annealing, which is desirable to provide microelectronic assemblies including hybrid bonded microelectronic components that can withstand backend processing after hybrid bonding.

The current preferred integrable dielectric material, SiO2, provided between Cu pads (as the electrically conductive structure) may be effective to achieve bond strengths or energies above about 1.5 J/m2 post bond and annealing. The use of an dielectric material including an oxide, such SiO2, however, becomes challenging for bonding pitches of about 10 um or less, because of resulting Cu to Cu (or other metal to metal electromigration in that dielectric material including an oxide, such as SiO2).

Although alternate dielectrics, such as carbon-doped silicon nitride, have been explored to resolve electromigration issues of metals of the electrically conductive structures, such alternate dielectrics have presented their own bonding challenges. For example, a dielectric including SiCN used in hybrid bonding results in bond energies less than 1.5 J/m2 if used without pre-bonding plasma treatments and/or extended higher temperature post bond annealing. However, even if pre-bonding plasma treatments are used, they may result in damage to the electrically conductive structures. In addition, higher post bond annealing temperatures, for example those above 300 degrees Centigrade, can results in the reflow of electrically conductive structures, and are therefore not backend processing compatible. Another challenge for hybrid bonding schemes is that, during metal polishing when electrically conductive structures are being formed, some electrically conductive structures tend to exhibit dishing post polish and right before bonding, resulting in uneven bonds, open joints between electrically conductive structures, high joint stress from bulging of electrically conductive structures (which may sometimes lead to delamination post bond).

In FIGS. 1A-1D and 2A-2D, some reference numerals may be referred to in the alternative, such as, by way of example, referring to an element "Xa/Xb." In such a case, reference is being made to each of element Xa and element Xb, individually, and the notation Xa/Xb would have been used for the matter of conciseness.

An explanation will now follow below regarding the state-of-the-art in the context of FIGS. 1A, 1B, 1C and 1D. FIGS. 1A-1D together show various stages of a state of the art process flow for hybrid bonding.

FIG. 1A is a cross sectional view of two microelectronic structures 102a and 102b to be further processed before undergoing hybrid bonding according to the state of the art. Microelectronic structures 102a and 102b respectively include substrates 104a and 104b, upon which, respectively, an etch stop/barrier layer 106a/106b may be deposited. The etch stop/barrier layer 106a/106b may include, for example, SiC. On the etch stop/barrier layer 106a/106b, a dielectric layer 108a/108b is provided, which presents openings therein for an electrically conductive layer 110a/110b. Thus, the electrically conductive layer 110a/110b as shown in FIG. 1A defines a number of contacts that are embedded within openings defined in the dielectric layer 108a/108b. The electrically conductive layer, which may, for example, be provided by way of electroplating, may include one or more electrically conductive metals therein, such as, for example Cu, or any other electrically conductive material according to application needs. The electrically conductive layer includes first portions 112a/112b that fill the openings in the dielectric layer 108a/108b, and a second portion 114a/114b that extends on the first portions, and on the dielectric layer 108a/108b as shown. Structures 102a/102b may be provided using a dual damascene process, hence the overburden in the form of the second portion 114a/114b.

FIG. 1B is a cross sectional view of two microelectronic components 116a/116b resulting from a polishing of the microelectronic structures 102a/102b of FIG. 1A, the polishing for hybrid bonding of the microelectronic components according to the state of the art. The M7s 102a/102b are subjected to a polishing process, for example a chemical mechanical polishing (CMP) process, to remove the overburden, or second portion 114a/114b, and to expose top surfaces of the first portions 112a/112b. In FIG. 1B, first portions 112a/112b correspond to electrically conductive structures of respective microelectronic components 116a/116b of FIG. 1B, obtained after the CMP process. For example, M8 116a may include a first wafer and M8 116b may include a second wafer to be hybrid bonded to the first wafer. Alternatively, M8 116a may include a first die and M8 116b may include a second die to be hybrid bonded to the first die. As can be seen from FIG. 1B, a polishing process on a dual damascene structure can result in recesses 115a/115b being defined on some or all of the electrically conductive structures 112a/112b, disadvantageously presenting an uneven bonding surface for hybrid bonding.

FIG. 1C is a cross sectional view of the two microelectronic components 116a and 116b of FIG. 1B undergoing a plasma treatment procedure for hybrid bonding of the microelectronic components of FIG. 1B according to the state of the art. The plasma treatment procedure, or plasma activation procedure, has as a goal to provide surface modification of the dielectric layer 108a/108b, and to increase its hydrophilicity to allow hybrid bonding that results, to the extent possible, in a strong bond so that post-processing or backend processing can happen without compromising the hybrid bond or without causing separation of the hybrid bonded joints with respect to one another.

FIG. 1D is a cross sectional view of the two microelectronic components of FIG. 1C after the plasma treatment procedure and during a hybrid bonding and anneal process according to the state of the art. Here, a microelectronic assembly 118 is shown, which includes microelectronic components 116a and 116b being hybrid bonded together in a bonding chamber using an anneal process. The annealing may take place at temperatures at or above 300 degrees Centigrade, for example in a bonding chamber.

The hybrid bonding scheme of the state of the art presents a number of disadvantages, some of which can be seen in FIG. 1D. For example, the resultant microelectronic assembly 118 as can be seen in FIG. 1D can exhibit separations or voids 117 at a location of the electrically conductive interface 119 by virtue of the dishings 115a/115b of the metal of the electrically conductive structures that resulted from the polishing described in the context of FIG. 1B above. In addition, the high temperature anneal process can result in a reflow of the metal of the electrically conductive structures in electrically conductive structures 112a/112b, which can cause a weak hybrid bond or even separation of some or all of the metal to metal joints because of the metal of the electrically conductive structures protruding above an upper surface of the dielectric layer 108a/108b. The latter is even more true since the dielectric to dielectric bond tends to not be as strong as a metal to metal bond, and tends to be unable to hold the joints together in the event of a protrusion by the metal of the electrically conductive structures. Moreover, if the pitch between the electrically conductive structures is low, for example less than 10 um, shorts can additionally occur between them, in part as a result of the anneal process. As a result of the above, the bond energy provided by a hybrid bonding scheme according to the state of the art may not reach desired levels, and may further be ineffective for electrically conductive structure pitches less than about 10 um. In addition, a hybrid bonding scheme according to the prior art may, because of plasma activation, result in metal of the electrically conductive structures that is disadvantageously oxidized, leading to a decay in the conductivity of the corresponding electrically conductive structures.

Low temperature dielectrics have also been used in hybrid bonding. However, such dielectrics have resulted in low bond energies where extensive pre-plasma activation, and/or post bonding anneals of a higher temperature and/or longer duration were not used, which processes bring about their own disadvantages, as noted above in relation to the scheme of FIGS. 1A-1D. Alternate surface treatments and/or surface modifications post dielectric deposition to increase hydrophilicity or to increase post bond energy have been explored, but present concerns of with respect to dielectric and/or in surface damage to the metal of the electrically conductive structures that in turn translates into an increase in post bonding voids and/or into lower bond energies.

Details of some embodiments will be described in further detail in relation to FIGS. 2A-2D below, after general remarks, in the immediate next few paragraphs, regarding the scope of the disclosure.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the instant detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized, and structural or logical changes may be made without departing from the scope of the present disclosure. Therefore, the following detailed description is not to be taken in a limiting sense, and the scope of embodiments is defined by the appended claims and their equivalents.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with passive heat spreaders, interface layers, TIMs, top dies, side dies, substrates, and package substrates.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

An explanation will now follow below regarding embodiments in the context of FIGS. 2A, 2B, 2C and 2D. FIGS. 2A-2D together show various stages of a process flow for hybrid bonding according to an embodiment. As between FIGS. 1A-1D and 2A-2D, like components are indicated using like reference numerals, and, therefore, a description of such components may not be provided again in the context of FIGS. 2A-2D.

Figures 2A, 2B, 2C, 2D:
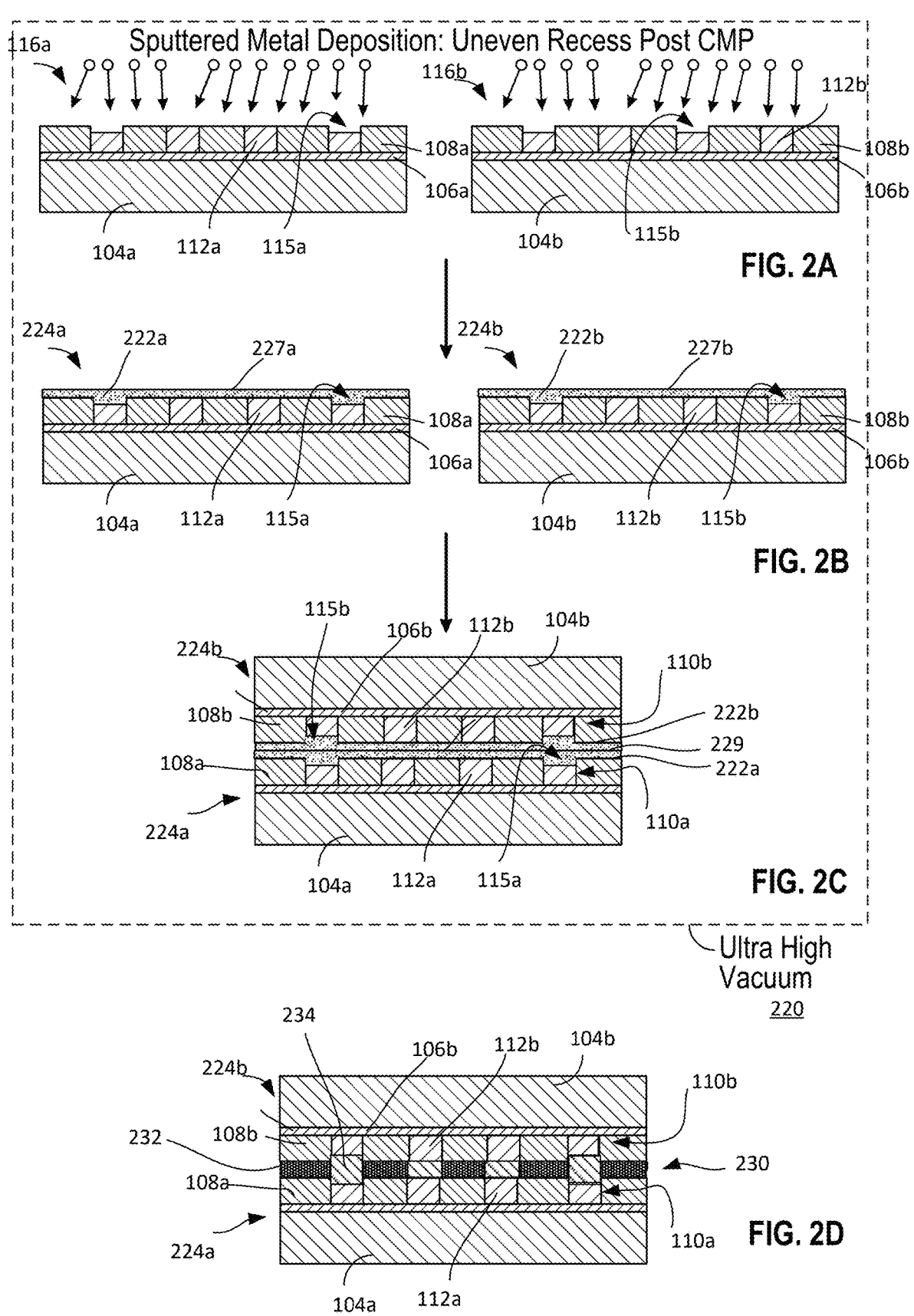
FIG. 2A is a cross sectional view of two microelectronic components similar to those of FIG. 1B, and in the process of metal deposition for hybrid bonding according to an embodiment.
FIG. 2B is a cross sectional view of the two microelectronic components of FIG. 2A after metal deposition for hybrid bonding according to an embodiment.
FIG. 2C is a cross sectional view of the two microelectronic components of FIG. 2B undergoing in-situ atomic diffusion bonding as part of a hybrid bonding of the microelectronic components of FIG. 2B according to an embodiment.
FIG. 2D is a cross sectional view of a microelectronic assembly including the two microelectronic components of FIG. 2C after in-situ atomic diffusion bonding and during a hybrid bonding and anneal process according to an embodiment.

FIG. 2A is a cross sectional view of two microelectronic structures 116a and 116b identical to those of FIG. 1B, and in the process of metal deposition for hybrid bonding according to an embodiment. The microelectronic structures 116a and 116b shown in FIG. 2A may be provided using similar processes to those described above to obtain such structures, including, for example, a dual damascene process as shown in FIG. 1A followed by polishing as described in relation to FIG. 1B, such as polishing using CMP, which, in the shown example results in dishing 115a/115b as shown. In FIG. 2A, the dielectric layer 108a/108b may include a dielectric material that is an oxide (an oxide dielectric material).

Referring now to FIGS. 2A and 2B, according to an embodiment, a thin metal layer (interface metal layer) 222a/222b, such as, for example, an interface metal layer having a thickness of about 1 nm to about 2 nm, may be deposited on the electrically conductive structure 112a/112b. A deposition process may include sputtering in an UHV environment 220. The UHV may be provided to prevent metal oxidation of the metal being deposited, and of the metal of the electrically conductive structures, during the processes of FIG. 2A, and further during the processes of FIGS. 2B and 2C to be described further below. Sputtering may involve the use of an argon plasma, traces of which may remain in the resulting sputtered metal film. According to an embodiment, the interface metal layer may include Ti, and the sputtering may include a sputtering of Ti using an argon plasma.

Referring to FIG. 2B, the resulting structure of FIG. 2B is a temporary microelectronic structure 224a/224b that includes the interface metal layer 222a/222b on the microelectronic structure 116a/116b. In temporary microelectronic structure 224a/224b, the interface metal layer 222a/222b fills the recesses or dishings 115a/115b created during the polishing process that was used to provides the structures 116a and 116b of FIG. 2A.

Referring still to FIGS. 2A and 2B, the interface metal layer may be provided using other deposition techniques, such as, for example, atomic layer deposition (ALD), which may be under UHV, and which may, for example use organometallic materials as chemical precursors that include carbon bonds. In such a case, the deposited interface metal layer may include carbon, which may be visible using X-Ray photoelectron spectroscopy (XPS).

Referring still to FIGS. 2A and 2B, the interface metal layer may be provided using other deposition techniques, such as, for example, physical vapor deposition (PVD) techniques other than sputtering. The PVD may be under UHV, and may, for example use nitrogen and/or carbon as a reactive gas. In such a case, the deposited interface metal layer may include carbon and/or nitrogen which may be visible using X-Ray photoelectron spectroscopy (XPS).

FIG. 2C is a cross sectional view is shown of a temporary microelectronic assembly 226 including the two temporary microelectronic components 224a/224b of FIG. 2B undergoing in-situ atomic diffusion bonding as part of a hybrid bonding scheme according to an embodiment. The in-situ atomic diffusion bonding may occur in the UHV environment referred to in the context of the processes of FIGS. 2A and 2B, and my occur, for example, at room temperature. Atomic diffusion bonding (ADB) involves the electromigration of atoms as between neighboring planes offered by respective bonding surfaces 227a/227b of the interface metal layers 222a/222b when those bonding surfaces are brought together, for example using mechanical pressure, to form a bonding interface 229 therebetween. During this phase, the touching interface metal layers may cause electromigration of the interface metal of the interface metal layers 222a and 222b across bonding interface 229, thus causing an ADB of the two interface metal layers 222a and 222b together.

FIG. 2D is a cross sectional view of a microelectronic assembly 228 formed from the temporary microelectronic assembly 226 of FIG. 2C after a post bond anneal procedure. The microelectronic assembly includes an interface layer 230 bonding the first microelectronic structure 116a to the second microelectronic structure 116b. In order to obtain the interface layer 230, the microelectronic assembly 226 may, according to an embodiment, be subjected to an annealing process to bring about inter-diffusion as between oxygen atoms of the oxide dielectric material and atoms of the interface metal to form an interfacial metal oxide layer 232 therefrom. For example, if the interface metal includes Ti, and the oxide dielectric material include SiO2, the interfacial metal oxide layer 232 may include a titanium oxide dielectric material. Annealing as shown in FIG. 2D may also include an electromigration of atoms of metal of the electrically conductive structures into the interface layer 229, especially at the surfaces of the interface layer contacting the electrically conductive structures. In such a case, in certain embodiments, a concentration of the metal of the electrically conductive structures may be larger near the surfaces of the interface layer contacting the electrically conductive structures as compared with portions of the electrically conductive layer further and furthest from such surfaces. Annealing according to some embodiments may take place at temperatures below 300 degrees Centigrade, for example at temperatures including 200 degrees Centigrade, or 100 degrees Centigrade, to name a few possibilities. Annealing according to some embodiments may have a duration of about 1 hour and may for example be carried out in a non-vacuum environment.

The interface metal may include a metal that has an aptitude for combining with oxygen in the oxide dielectric material of the dielectric layer. Ti represents an example of such a metal, and can oxidize readily with an oxide dielectric material, such as SiO2. The oxidation of the interface metal material addresses the shorting problem mentioned above in the context of the metal of the electrically conductive structures possibly diffusing into the dielectric. Namely, the resulting interfacial metal oxide layer such as layer 232 creates an insulative barrier that discourages diffusion of the metal atoms of the electrically conductive structures into the dielectric regions 234 of the interface layer.

Ti, in the presence of SiO2, converts into TiO2 conversion on annealing, especially with thinner Ti films, such as those having a thickness between about 1 nm and about 2 nm. The process is even more effective with each interface metal layer 222a and 222b, for example if including Ti, having a thickness of about 1 nm, resulting in an interface layer 230 that has a thickness of about 2 nm, with the oxide dielectric material, such as SiO2, on a stop surface and bottom surface thereof. The basic reaction as between Ti and SiO2 may result in the formation of TiOx, TiySiz, and SiO2. However, the Ti silicide (TiySiz) formation is typically formed only under an excess amount of Ti. However, Ti exhibits a preference for boning with oxygen. According to one embodiment, SiO2 dielectric structure 108a and 108b at each side of the combined Ti layer 222a and 222b (see e.g. FIG. 2C), has a thickness of at least more than 125 times that of the combined thicknesses of both Ti layers 222a and 222b, and preferably 250 times that of the combined thicknesses of both Ti layers 222a and 222b (e.g. see FIG. 2C and SiO2 layers 108a and 108b each having a thickness of about 500 nm and Ti layers 222a and 222b each having a thickness of 1 nm). In the case of the latter, there would be an overwhelming amount of oxygen available for bonding with a comparatively little amount Ti, which would inhibit or greatly reduce the extent of the bonding of Ti with silicon to for a titanium silicide compound.

The decreasing reaction rate in thinner films of Ti with SiO2 to form titanium silicide is attributable to a decrease in metal "supply" of Ti as the oxygen (O) concentration increases with an increase in SiO2. Metal atoms bonded to oxygen are thus not free to form silicide, and, therefore, the presence of such bonding (to form titanium oxide) reduces the supply of metal to the reaction with silicon. Since a thinner metal film will have a higher oxygen concentration than a thicker one for the same amount of silicide formed, the thinner film has a lower metal supply that would contribute to silicide formation.

Note that, while single layers are shown in FIGS. 2A-2D for each of the substrate, the barrier layer, the dielectric layer and the electrically conductive layer, it is to be appreciated that such layers may be made of multiple sublayers having differing compositions.

The substrates 104a and 104b may include silicon. The substrates 104a and 104b may each include a high-density organic substrate such as a high-density package (HDP) substrate or the like. The substrates 104a/104b may include a plurality of redistribution layers (RDLs) comprised of traces with L/S of approximately or less than 2/2 um (i.e., fine/ultrafine traces), lithographically-defined vias, zero-misalignment vias, and/or via pads with fine (or ultrafine) pitches.

The package substrates 104a/104b may include, but is not limited to, a package, a substrate, a printed circuit board (PCB), and/or a motherboard. The PCB may be made of an FR-4 glass epoxy base with thin copper foil laminated on both sides. For some embodiments, a multilayer PCB can be used, with pre-preg and copper foil used to make additional layers. For example, the multilayer PCB may include one or more dielectric layers, where each dielectric layer may be a photosensitive dielectric layer. The PCB may include a plurality of conductive layers, which may further include copper (or metallic) traces, lines, pads, vias, via pads, holes, and/or planes.

Advantageously, embodiments mitigate the effects of the dishing of electrically conductive structures in the context of hybrid bonding, by providing an interface layer that fills the recesses brought about by such dishing, and eliminating the current requirement of dishing control used in state of the art hybrid bonding schemes, leading to better and more reliable manufacturability.

Advantageously, embodiments provide a high yield hybrid bonding mechanism that, by virtue of the UHV in situ deposition and bonding method described above, reduces and can at times substantially eliminate post bonding electrically conductive structure opens, such as voids 117 of FIG. 1D. The latter is at least because the deposition of the thin metal layer, such as interface metal layer 227a/227b, ultimately results into bond energies comparable to those achieved in bulk metal to metal bonds. In addition, with embodiments, the post bond voids, such as voids 117 in FIG. 1D, which can result from water formation as a byproduct of the state of the art hybrid bonding scheme because of plasma treatments would be eliminated as embodiments promote a direct metal to metal bond on of the electrically conductive structures.

In addition, advantageously, some embodiments provide an easy to implement hybrid bonding scheme by virtue of a ready availability of commercially available 300 mm atomic diffusion bonding products. Moreover, some embodiments provide a hybrid bonding scheme that may be achieved with low manufacturing costs, as alternate dielectrics (e.g. SiCN) can be deposited in addition to the oxide dielectric material and used to enable hybrid bond scaling without developing alternate dielectric materials/expensive plasma treatments/surface treatment methods required to meet bond energies and/or achieve electromigration boundaries. Some embodiments eliminate the requirement for lengthy (over one hour) and high temperature (300 degrees Centigrade or more) post bond anneals as is being done in the state of the art.

Figure 3:
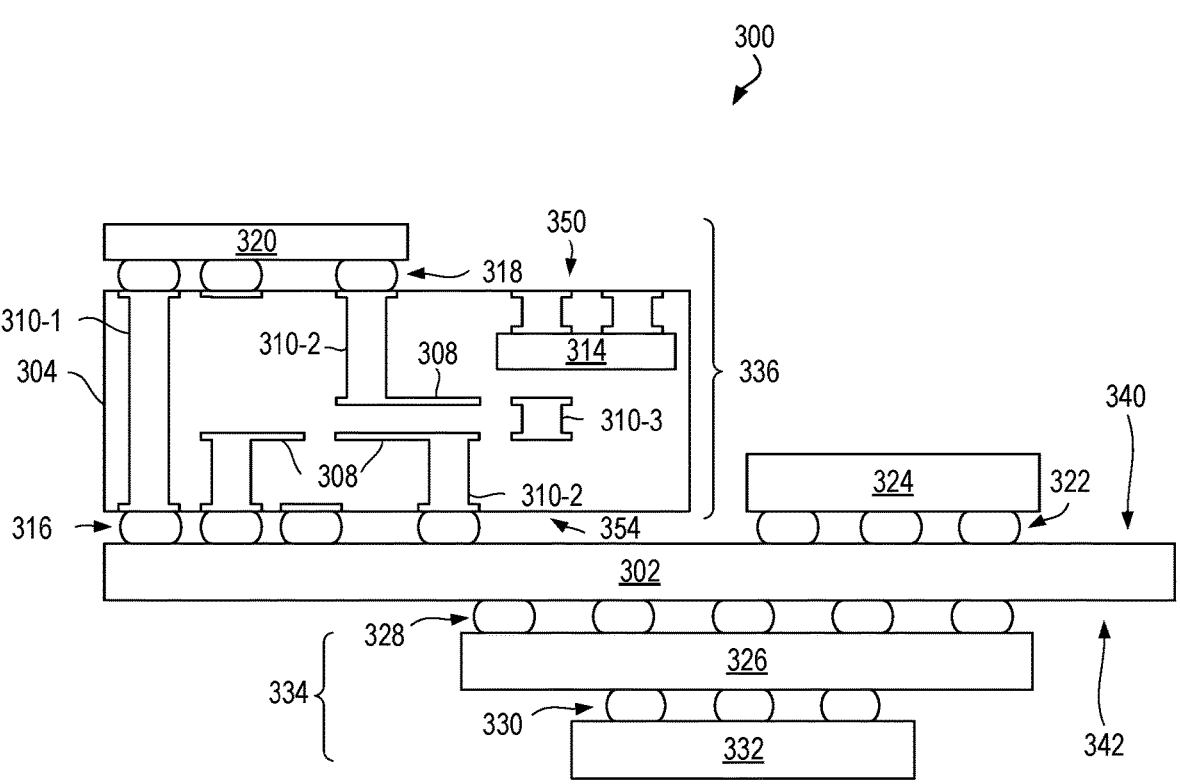
FIG. 3 is a cross-sectional side view of an integrated circuit device assembly that may include a MCP in accordance with any of the embodiments disclosed herein.

FIG. 3 is a cross-sectional side view of an integrated circuit device assembly 300 that may include one or more integrated circuit structures each including any of the microelectronic assembly embodiments described herein (e.g. microelectronic assembly 228 of FIG. 2D. The integrated circuit device assembly 300 includes a number of components disposed on a circuit board 302 (which may be a motherboard, system board, mainboard, etc.). The integrated circuit device assembly 300 includes components disposed on a first face 340 of the circuit board 302 and an opposing second face 342 of the circuit board 302; generally, components may be disposed on one or both faces 340 and 342.

Any of the integrated circuit components discussed below with reference to the integrated circuit device assembly 300 may include an integrated circuit structure including a cascaded a MCP as disclosed herein.

In some embodiments, the circuit board 302 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 302. In other embodiments, the circuit board 302 may be a non-PCB substrate. The integrated circuit device assembly 300 illustrated in FIG. 3 includes a package-on-interposer structure 336 coupled to the first face 340 of the circuit board 302 by coupling components 316. The coupling components 316 may electrically and mechanically couple the package-on-interposer structure 336 to the circuit board 302, and may include solder balls (as shown in FIG. 3), pins (e.g., as part of a pin grid array (PGA)), contacts (e.g., as part of a land grid array (LGA)), male and female portions of a socket, an adhesive, an underfill material, and/or any other suitable electrical and/or mechanical coupling structure.

The package-on-interposer structure 336 may include an integrated circuit component 320 coupled to an interposer 304 by coupling components 318. The coupling components 318 may take any suitable form for the application, such as the forms discussed above with reference to the coupling components 316. Although a single integrated circuit component 320 is shown in FIG. 3, multiple integrated circuit components may be coupled to the interposer 304; indeed, additional interposers may be coupled to the interposer 304. The interposer 304 may provide an intervening substrate used to bridge the circuit board 302 and the integrated circuit component 320.

The integrated circuit component 320 may be a packaged or unpackaged integrated circuit product that includes one or more integrated circuit dies. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 320, a single monolithic integrated circuit die comprises solder bumps attached to contacts on the die. The solder bumps allow the die to be directly attached to the interposer 304. The integrated circuit component 320 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 320 can comprise one or more additional active or passive devices such as capacitors, decoupling capacitors, resistors, inductors, fuses, diodes, transformers, sensors, electrostatic discharge (ESD) devices, and memory, devices.

In embodiments where the integrated circuit component 320 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 320 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 304 may spread connections to a wider pitch or reroute a connection to a different connection. For example, the interposer 304 may couple the integrated circuit component 320 to a set of ball grid array (BGA) conductive contacts of the coupling components 316 for coupling to the circuit board 302. In the embodiment illustrated in FIG. 3, the integrated circuit component 320 and the circuit board 302 are attached to opposing sides of the interposer 304; in other embodiments, the integrated circuit component 320 and the circuit board 302 may be attached to a same side of the interposer 304. In some embodiments, three or more components may be interconnected by way of the interposer 304.

In some embodiments, the interposer 304 may be formed as a PCB, including multiple metal layers separated from one another by layers of dielectric material and interconnected by electrically conductive vias. In some embodiments, the interposer 304 may be formed of an epoxy resin, a fiberglass-reinforced epoxy resin, an epoxy resin with inorganic fillers, a ceramic material, or a polymer material such as polyimide. In some embodiments, the interposer 304 may be formed of alternate rigid or flexible materials that may include the same materials described above for use in a semiconductor substrate, such as silicon, germanium, and other group III-V and group IV materials. The interposer 304 may include metal interconnects 308 and vias 310, including but not limited to through hole vias 310-1 (that extend from a first face 350 of the interposer 304 to a second face 354 of the interposer 304), blind vias 310-2 (that extend from the first or second faces 350 or 354 of the interposer 304 to an internal metal layer), and buried vias 310-3 (that connect internal metal layers).

In some embodiments, the interposer 304 can comprise a silicon interposer. Through silicon vias (TSV) extending through the silicon interposer can connect connections on a first face of a silicon interposer to an opposing second face of the silicon interposer. In some embodiments, an interposer 304 comprising a silicon interposer can further comprise one or more routing layers to route connections on a first face of the interposer 304 to an opposing second face of the interposer 304.

The interposer 304 may further include embedded devices 314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 304. The package-on-interposer structure 336 may take the form of any of the package-on-interposer structures known in the art. In embodiments where the interposer is a non-printed circuit board The integrated circuit device assembly 300 may include an integrated circuit component 324 coupled to the first face 340 of the circuit board 302 by coupling components 322. The coupling components 322 may take the form of any of the embodiments discussed above with reference to the coupling components 316, and the integrated circuit component 324 may take the form of any of the embodiments discussed above with reference to the integrated circuit component 320.

The integrated circuit device assembly 300 illustrated in FIG. 3 includes a package-on-package structure 334 coupled to the second face 342 of the circuit board 302 by coupling components 328. The package-on-package structure 334 may include an integrated circuit component 326 and an integrated circuit component 332 coupled together by coupling components 330 such that the integrated circuit component 326 is disposed between the circuit board 302 and the integrated circuit component 332. The coupling components 328 and 330 may take the form of any of the embodiments of the coupling components 316 discussed above, and the integrated circuit components 326 and 332 may take the form of any of the embodiments of the integrated circuit component 320 discussed above. The package-on-package structure 334 may be configured in accordance with any of the package-on-package structures known in the art.

Figure 4:
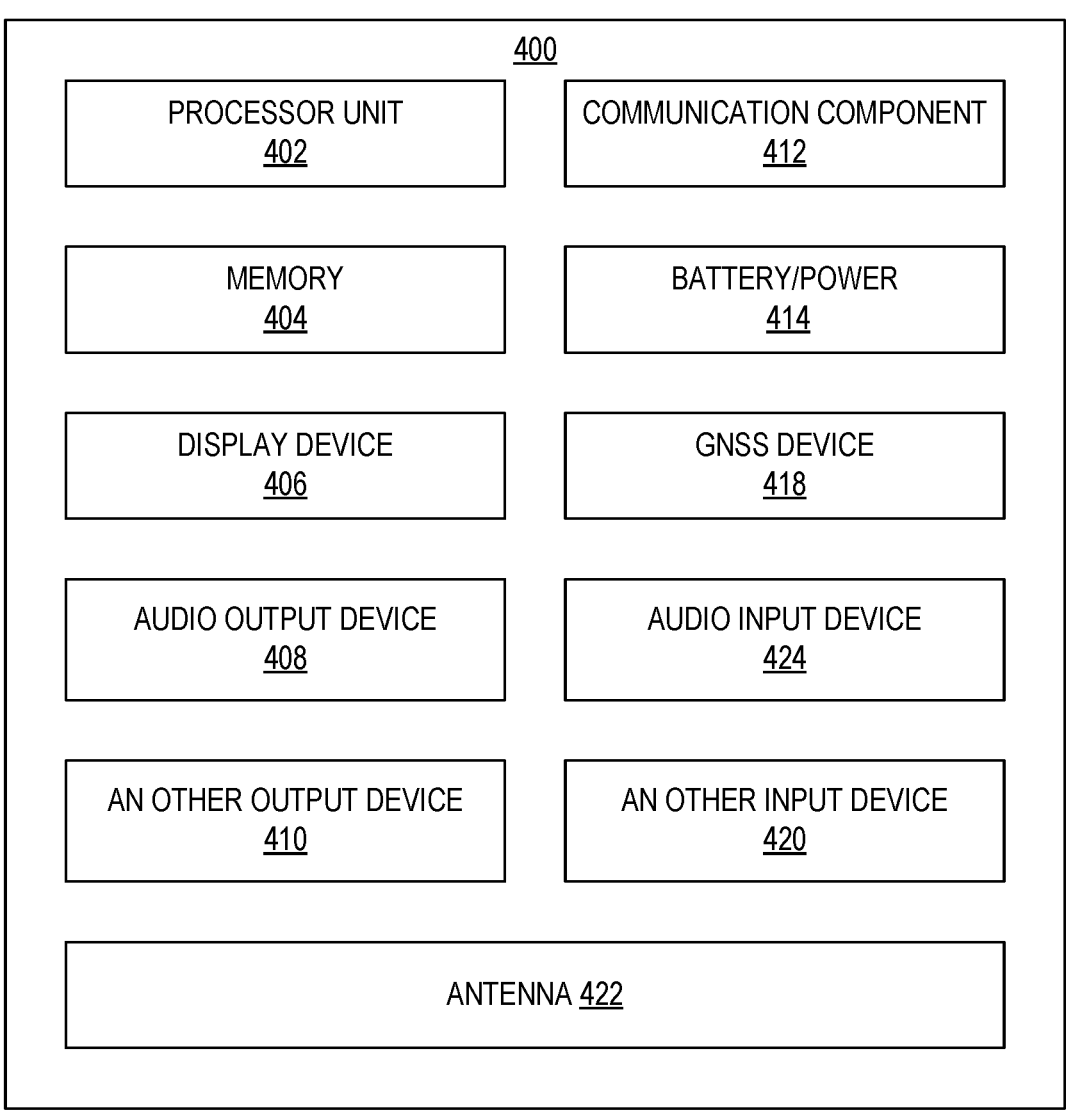
FIG. 4 is a block diagram of an example electrical device that may include a MCP assembly, in accordance with any of the embodiments disclosed herein.

FIG. 4 is a block diagram of an example electrical device 400 that may include one or more of the embodiments of a microelectronic assembly disclosed herein. For example, any suitable ones of the components of the electrical device 400 may include one or more of the integrated circuit device assemblies 300, integrated circuit components 320, and/or embodiment MCPs disclosed herein. A number of components are illustrated in FIG. 4 as included in the electrical device 400, but any one or more of these components may be omitted or duplicated, as suitable for the application. In some embodiments, some or all of the components included in the electrical device 400 may be attached to one or more motherboards mainboards, or system boards. In some embodiments, one or more of these components are fabricated onto a single system-on-a-chip (SoC) die.

Additionally, in various embodiments, the electrical device 400 may not include one or more of the components illustrated in FIG. 4, but the electrical device 400 may include interface circuitry for coupling to the one or more components. For example, the electrical device 400 may not include a display device 406, but may include display device interface circuitry (e.g., a connector and driver circuitry) to which a display device 406 may be coupled. In another set of examples, the electrical device 400 may not include an audio input device 424 or an audio output device 408, but may include audio input or output device interface circuitry (e.g., connectors and supporting circuitry) to which an audio input device 424 or audio output device 408 may be coupled.

The electrical device 400 may include one or more processor units 402 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 402 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 400 may include a memory 404, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 404 may include memory that is located on the same integrated circuit die as the processor unit 402. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 400 can comprise one or more processor units 402 that are heterogeneous or asymmetric to another processor unit 402 in the electrical device 400. There can be a variety of differences between the processing units 402 in a system in terms of a spectrum of metrics of merit including architectural, micro-architectural, thermal, power consumption characteristics, and the like. These differences can effectively manifest themselves as asymmetry and heterogeneity among the processor units 402 in the electrical device 400.

In some embodiments, the electrical device 400 may include a communication component 412 (e.g., one or more communication components). For example, the communication component 412 can manage wireless communications for the transfer of data to and from the electrical device 400. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 412 may operate in accordance with other wireless protocols in other embodiments. The electrical device 400 may include one or more antennas, such as antenna 422 to facilitate wireless communications and/or to receive other wireless communications (such as AM or FM radio transmissions).

In some embodiments, the communication component 412 may manage wired communications, such as electrical, optical, or any other suitable communication protocols (e.g., IEEE 802.3 Ethernet standards). As noted above, the communication component 412 may include multiple communication components. For instance, a first communication component 412 may be dedicated to shorter-range wireless communications such as Wi-Fi or Bluetooth, and a second communication component 412 may be dedicated to longer-range wireless communications such as global positioning system (GPS), EDGE, GPRS, CDMA, WiMAX, LTE, EV-DO, or others. In some embodiments, a first communication component 412 may be dedicated to wireless communications, and a second communication component 412 may be dedicated to wired communications.

The electrical device 400 may include battery/power circuitry 414. The battery/power circuitry 414 may include one or more energy storage devices (e.g., batteries or capacitors) and/or circuitry for coupling components of the electrical device 400 to an energy source separate from the electrical device 400 (e.g., AC line power).

The electrical device 400 may include a display device 406 (or corresponding interface circuitry, as discussed above). The display device 406 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 400 may include an audio output device 408 (or corresponding interface circuitry, as discussed above). The audio output device 408 may include any embedded or wired or wirelessly connected external device that generates an audible indicator, such speakers, headsets, or earbuds.

The electrical device 400 may include an audio input device 424 (or corresponding interface circuitry, as discussed above). The audio input device 424 may include any embedded or wired or wirelessly connected device that generates a signal representative of a sound, such as microphones, microphone arrays, or digital instruments (e.g., instruments having a musical instrument digital interface (MIDI) output). The electrical device 400 may include a Global Navigation Satellite System (GNSS) device 418 (or corresponding interface circuitry, as discussed above), such as a Global Positioning System (GPS) device. The GNSS device 418 may be in communication with a satellite-based system and may determine a geolocation of the electrical device 400 based on information received from one or more GNSS satellites, as known in the art.

The electrical device 400 may include another output device 410 (or corresponding interface circuitry, as discussed above). Examples of the other output device 410 may include an audio codec, a video codec, a printer, a wired or wireless transmitter for providing information to other devices, or an additional storage device.

The electrical device 400 may include another input device 420 (or corresponding interface circuitry, as discussed above). Examples of the other input device 420 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 400 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 400 may be any other electronic device that processes data. In some embodiments, the electrical device 400 may comprise multiple discrete physical components. Given the range of devices that the electrical device 400 can be manifested as in various embodiments, in some embodiments, the electrical device 400 can be referred to as a computing device or a computing system.

FIG. 5 is a flow chart of a process 500 of making a microelectronic assembly of a semiconductor package according to some embodiments. At operation 502, the process includes providing a first microelectronic structure including a first substrate, a first dielectric layer disposed on the first substrate and defining openings therein, and a first electrically conductive layer including first electrically conductive structures in the openings of the first dielectric layer. At operation 504, providing a second microelectronic structure including a second substrate, a second dielectric layer disposed on the second substrate and defining openings therein, and a second electrically conductive layer including second electrically conductive structures in the openings of the second dielectric layer. At operation 506, depositing a first metal layer on a bonding surface of the first microelectronic structure and a second metal layer on a bonding surface of the second microelectronic structure. At operation 508, after depositing, bonding the first metal layer to the second metal layer to form an interface layer therefrom including dielectric portions in registration with the first dielectric layer and the second dielectric layer, and electrically conductive portions in registration with the first electrically conductive structures and the second electrically conductive structures, wherein the dielectric portions include an oxide of a metal of the first metal layer and of the second metal layer, and the electrically conductive portions include the metal.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of embodiments has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

In embodiments, the phrase "A is located on B" means that at least a part of A is in direct physical contact or indirect physical contact (having one or more other features between A and B) with at least a part of B.

In the instant description, "A is adjacent to B" means that at least part of A is in direct physical contact with at least a part of B.

In the instant description, "B is between A and C" means that at least part of B is in or along a space separating A and C and that the at least part of B is in direct or indirect physical contact with A and C.

In the instant description, "A is attached to B" means that at least part of A is mechanically attached to at least part of B, either directly or indirectly (having one or more other features between A and B).

The use of reference numerals separated by a "/", such as "102/104" for example, is intended to refer to 102 or 104 as appropriate. Otherwise, the forward slash ("/") as used herein means "and/or."

The use of the techniques and structures provided herein can be detected using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, such tools can indicate an integrated circuit including at least one MCP including an interposer bonded to a MCP subassembly through direct dielectric-to-dielectric bonding as described herein.

In some embodiments, the techniques, processes and/or methods described herein can be detected based on the structures formed therefrom. In addition, in some embodiments, the techniques and structures described herein can be detected based on the benefits derived therefrom. Numerous configurations and variations will be apparent in light of this disclosure.

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "according to some embodiments," "in accordance with embodiments," or "in embodiments," which may each refer to one or more of the same or different embodiments. Furthermore, the terms "comprising," "including," "having," and the like, as used with respect to embodiments of the present disclosure, are synonymous.

"Coupled" as used herein means that two or more elements are in direct physical contact, or that that two or more elements indirectly physically contact each other, but yet still cooperate or interact with each other (i.e. one or more other elements are coupled or connected between the elements that are said to be coupled with each other). The term "directly coupled" means that two or more elements are in direct contact.

As used herein, the term "module" refers to being part of, or including an ASIC, an electronic circuit, a system on a chip, a processor (shared, dedicated, or group), a solid state device, a memory (shared, dedicated, or group) that execute one or more software or firmware programs, a combinational logic circuit, and/or other suitable components that provide the described functionality.

As used herein, "electrically conductive" in some examples may refer to a property of a material having an electrical conductivity greater than or equal to 107 Siemens per meter (S/m) at 20 degrees Celsius. Examples of such materials include Cu, Ag, Al, Au, W, Zn and Ni.

As used herein, an "integrated circuit structure" may include one or more microelectronic dies.

In the corresponding drawings of the embodiments, signals, currents, electrical biases, or magnetic or electrical polarities may be represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, polarity, current, voltage, etc., as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the elements that are connected, without any intermediary devices. The term "coupled" means a direct or indirect connection, such as a direct electrical, mechanical, or magnetic connection between the elements that are connected or an indirect connection, through one or more passive or active intermediary devices. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., nMOS, NPN BJT, etc.) and the term "MP" indicates a p-type transistor (e.g., pMOS, PNP BJT, etc.).

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

EXAMPLES

Some non-limiting example embodiments are set forth below.

Example 1 includes a microelectronic assembly, comprising: a first microelectronic structure including a first substrate, a first dielectric layer disposed on the first substrate and defining openings therein, and a first electrically conductive layer including first electrically conductive structures in the openings of the first dielectric layer; a second microelectronic structure including a second substrate, a second dielectric layer disposed on the second substrate and defining openings therein, and a second electrically conductive layer including second electrically conductive structures in the openings of the second dielectric layer; and an interface layer between the first microelectronic structure and the second microelectronic structure, the interface layer including dielectric portions in registration with the first dielectric layer and the second dielectric layer, and electrically conductive portions in registration with the first electrically conductive structures and the second electrically conductive structures, wherein the dielectric portions include an oxide of a metal, and the electrically conductive portions include the metal.

Example 2 includes the subject matter of Example 1, wherein the metal is a second metal, the first electrically conductive layer and the second electrically conductive layer including a first metal different from the second metal.

Example 3 includes the subject matter of Example 2, wherein the first metal includes copper, the second metal includes titanium, and the oxide of a metal includes titanium oxide.

Example 4 includes the subject matter of Example 2, wherein the electrically conductive portions include higher concentrations of the first metal at interfaces thereof with respective ones of the first electrically conductive layer and the second electrically conductive layer as compared with concentrations of the first metal at a distance from the interfaces within the electrically conductive portions.

Example 5 includes the subject matter of Example 1, wherein the interface layer includes at least one of argon, carbon or nitrogen.

Example 6 includes the subject matter of Example 1, wherein the first dielectric layer and the second dielectric layer include silicon dioxide.

Example 7 includes the subject matter of Example 1, wherein the interface layer has a thickness between about 2 nm to about 4 nm.

Example 8 includes the subject matter of Example 1, wherein a pitch between the first electrically conductive structures and the second electrically conductive structures measures less than about 10 microns.

Example 9 includes the subject matter of Example 1, wherein a bond energy between the first microelectronic structure and the second microelectronic structure is larger than about 2 J/m2.

Example 10 includes the subject matter of Example 1, wherein individual ones of the first microelectronic structure and the second microelectronic structure include a die or a wafer.

Example 11 includes a semiconductor package including: a package substrate; a microelectronic assembly disposed on the package substrate and including: a first microelectronic structure including a first substrate, a first dielectric layer disposed on the first substrate and defining openings therein, and a first electrically conductive layer including first electrically conductive structures in the openings of the first dielectric layer; a second microelectronic structure including a second substrate, a second dielectric layer disposed on the second substrate and defining openings therein, and a second electrically conductive layer including second electrically conductive structures in the openings of the second dielectric layer; and an interface layer between the first microelectronic structure and the second microelectronic structure, the interface layer including dielectric portions in registration with the first dielectric layer and the second dielectric layer, and electrically conductive portions in registration with the first electrically conductive structures and the second electrically conductive structures, wherein the dielectric portions include an oxide of a metal, and the electrically conductive portions include the metal.

Example 12 includes the subject matter of Example 11, wherein the metal is a second metal, the first electrically conductive layer and the second electrically conductive layer including a first metal different from the second metal.

Example 13 includes the subject matter of Example 12, wherein the first metal includes copper, the second metal includes titanium, and the oxide of a metal includes titanium oxide.

Example 14 includes the subject matter of Example 12, wherein the electrically conductive portions include higher concentrations of the first metal at interfaces thereof with respective ones of the first electrically conductive layer and the second electrically conductive layer as compared with concentrations of the first metal at a distance from the interfaces within the electrically conductive portions.

Example 15 includes the subject matter of Example 11, wherein the interface layer includes at least one of argon, carbon or nitrogen.

Example 16 includes the subject matter of Example 11, wherein the first dielectric layer and the second dielectric layer include silicon dioxide.

Example 17 includes the subject matter of Example 11, wherein the interface layer has a thickness between about 2 nm to about 4 nm.

Example 18 includes the subject matter of Example 11, wherein a pitch between the first electrically conductive structures and the second electrically conductive structures measures less than about 10 microns.

Example 19 includes the subject matter of Example 11, wherein a bond energy between the first microelectronic structure and the second microelectronic structure is larger than about 2 J/m2.

Example 20 includes the subject matter of Example 11, wherein individual ones of the first microelectronic structure and the second microelectronic structure include a die or a wafer.

Example 21 includes an integrated circuit (IC) device assembly including: a printed circuit board; and a plurality of integrated circuit components coupled to the printed circuit board, individual ones of the integrated circuit components including one or more semiconductor packages, individual ones of the semiconductor packages including a microelectronic assembly: a first microelectronic structure including a first substrate, a first dielectric layer disposed on the first substrate and defining openings therein, and a first electrically conductive layer including first electrically conductive structures in the openings of the first dielectric layer; a second microelectronic structure including a second substrate, a second dielectric layer disposed on the second substrate and defining openings therein, and a second electrically conductive layer including second electrically conductive structures in the openings of the second dielectric layer; and an interface layer between the first microelectronic structure and the second microelectronic structure, the interface layer including dielectric portions in registration with the first dielectric layer and the second dielectric layer, and electrically conductive portions in registration with the first electrically conductive structures and the second electrically conductive structures, wherein the dielectric portions include an oxide of a metal, and the electrically conductive portions include the metal.

Example 22 includes the subject matter of Example 21, wherein the metal is a second metal, the first electrically conductive layer and the second electrically conductive layer including a first metal different from the second metal.

Example 23 includes the subject matter of Example 22, wherein the first metal includes copper, the second metal includes titanium, and the oxide of a metal includes titanium oxide.

Example 24 includes the subject matter of Example 22, wherein the electrically conductive portions include higher concentrations of the first metal at interfaces thereof with respective ones of the first electrically conductive layer and the second electrically conductive layer as compared with concentrations of the first metal at a distance from the interfaces within the electrically conductive portions.

Example 25 includes the subject matter of Example 21, wherein the interface layer includes at least one of argon, carbon or nitrogen.

Example 26 includes the subject matter of Example 21, wherein the first dielectric layer and the second dielectric layer include silicon dioxide.

Example 27 includes the subject matter of Example 21, wherein the interface layer has a thickness between about 2 nm to about 4 nm.

Example 28 includes the subject matter of Example 21, wherein a pitch between the first electrically conductive structures and the second electrically conductive structures measures less than about 10 microns.

Example 29 includes the subject matter of Example 21, wherein a bond energy between the first microelectronic structure and the second microelectronic structure is larger than about 2 J/m2.

Example 30 includes the subject matter of Example 21, wherein individual ones of the first microelectronic structure and the second microelectronic structure include a die or a wafer.

Example 31 includes a method to form a microelectronic assembly of a semiconductor package, the method including: providing a first microelectronic structure including a first substrate, a first dielectric layer disposed on the first substrate and defining openings therein, and a first electrically conductive layer including first electrically conductive structures in the openings of the first dielectric layer; providing a second microelectronic structure including a second substrate, a second dielectric layer disposed on the second substrate and defining openings therein, and a second electrically conductive layer including second electrically conductive structures in the openings of the second dielectric layer; depositing a first metal layer on a bonding surface of the first microelectronic structure and a second metal layer on a bonding surface of the second microelectronic structure; and after depositing, bonding the first metal layer to the second metal layer to form an interface layer therefrom including dielectric portions in registration with the first dielectric layer and the second dielectric layer, and electrically conductive portions in registration with the first electrically conductive structures and the second electrically conductive structures, wherein the dielectric portions include an oxide of a metal of the first metal layer and of the second metal layer, and the electrically conductive portions include the metal.

Example 32 includes the subject matter of Example 31, wherein bonding includes using atomic diffusion bonding and annealing.

Example 33 includes the subject matter of Example 32, wherein depositing and using atomic diffusion bonding occur in an ultra-high vacuum environment.

Example 34 includes the subject matter of Example 31, wherein each of the first metal layer and the second metal layer has a thickness between about 1 nm and about 2 nm.

Example 35 includes the subject matter of Example 32, wherein annealing occurs at a temperature less than about 300 degrees Centigrade.

Example 36 includes the subject matter of Example 31, wherein depositing includes sputtering the metal onto the bonding surface of each of the first microelectronic structure and the second microelectronic structure.

Example 37 includes the subject matter of Example 31, wherein depositing includes using atomic layer deposition of the metal onto the bonding surface of each of the first microelectronic structure and the second microelectronic structure.

Example 38 includes the subject matter of Example 31, wherein depositing includes using physical vapor deposition of the metal onto the bonding surface of each of the first microelectronic structure and the second microelectronic structure.

Example 39 includes the subject matter of Example 31, wherein the metal is a second metal, the first electrically conductive layer and the second electrically conductive layer including a first metal different from the second metal.

Example 40 includes the subject matter of Example 39, wherein the first metal includes copper, the second metal includes titanium, and the oxide of a metal includes titanium oxide.

Example 41 includes the subject matter of Example 39, wherein the electrically conductive portions include higher concentrations of the first metal at interfaces thereof with respective ones of the first electrically conductive layer and the second electrically conductive layer as compared with concentrations of the first metal at a distance from the interfaces within the electrically conductive portions.

Example 42 includes the subject matter of Example 31, wherein the interface layer includes at least one of argon, carbon or nitrogen.

Example 43 includes the subject matter of Example 31, wherein the first dielectric layer and the second dielectric layer include silicon dioxide.

Example 44 includes the subject matter of Example 31, wherein the interface layer has a thickness between about 2 nm to about 4 nm.

Example 45 includes the subject matter of Example 31, wherein a pitch between the first electrically conductive structures and the second electrically conductive structures measures less than about 10 microns.

Example 46 includes the subject matter of Example 31, wherein a bond energy between the first microelectronic structure and the second microelectronic structure is larger than about 2 J/m2.

Example 47 includes the subject matter of Example 31, wherein individual ones of the first microelectronic structure and the second microelectronic structure include a die or a wafer.

What is claimed is:

1. A microelectronic assembly, comprising:
a first microelectronic structure including a first substrate, a first dielectric layer disposed on the first substrate and defining openings therein, and a first electrically conductive layer including first electrically conductive structures in the openings of the first dielectric layer;
a second microelectronic structure including a second substrate, a second dielectric layer disposed on the second substrate and defining openings therein, and a second electrically conductive layer including second electrically conductive structures in the openings of the second dielectric layer; and
an interface layer between the first microelectronic structure and the second microelectronic structure, the interface layer being substantially planar and having a top surface substantially parallel to and underlying a bottom surface of the first microelectronic structure, and a bottom surface substantially parallel to and overlying a top surface of the second microelectronic structure, the interface layer including dielectric portions coextensive with the first dielectric layer and the second dielectric layer, and electrically conductive portions coextensive with the first electrically conductive structures and the second electrically conductive structures, wherein the dielectric portions include an oxide of a metal, and the electrically conductive portions include the metal.

2. The microelectronic assembly of claim 1, wherein the metal is a second metal, the first electrically conductive layer and the second electrically conductive layer including a first metal different from the second metal.

3. The microelectronic assembly of claim 2, wherein the first metal includes copper, the second metal includes titanium, and the oxide of a metal includes titanium oxide.

4. The microelectronic assembly of claim 2, wherein the electrically conductive portions include higher concentrations of the first metal at interfaces thereof with respective ones of the first electrically conductive layer and the second electrically conductive layer as compared with concentrations of the first metal at a distance from the interfaces within the electrically conductive portions.

5. The microelectronic assembly of claim 1, wherein the interface layer includes at least one of argon, carbon or nitrogen.

6. The microelectronic assembly of claim 1, wherein the first dielectric layer and the second dielectric layer include silicon dioxide.

7. The microelectronic assembly of claim 1, wherein the interface layer has a thickness between about 2 nm to about 4 nm.

8. The microelectronic assembly of claim 1, wherein a pitch between the first electrically conductive structures and the second electrically conductive structures measures less than about 10 microns.

9. The microelectronic assembly of claim 1, wherein a bond energy between the first microelectronic structure and the second microelectronic structure is larger than about 2 J/m$^2$.

10. The microelectronic assembly of claim 1, wherein individual ones of the first microelectronic structure and the second microelectronic structure include a die or a wafer.

11. A semiconductor package including:
a package substrate;
a microelectronic assembly disposed on the package substrate and including:
a first microelectronic structure including a first substrate, a first dielectric layer disposed on the first substrate and defining openings therein, and a first electrically conductive layer including first electrically conductive structures in the openings of the first dielectric layer;
a second microelectronic structure including a second substrate, a second dielectric layer disposed on the second substrate and defining openings therein, and a second electrically conductive layer including second electrically conductive structures in the openings of the second dielectric layer; and
an interface layer between the first microelectronic structure and the second microelectronic structure, the interface layer being substantially planar and having a top surface substantially parallel to and underlying a bottom surface of the first microelectronic structure, and a bottom surface substantially parallel to and overlying a top surface of the second microelectronic structure, the interface layer including dielectric portions coextensive with the first dielectric layer and the second dielectric layer, and electrically conductive portions coextensive with the first electrically conductive structures and the second electrically conductive structures, wherein the dielectric portions include an oxide of a metal, and the electrically conductive portions include the metal.

12. The semiconductor package of claim 11, wherein the metal is a second metal, the first electrically conductive layer and the second electrically conductive layer including a first metal different from the second metal.

13. The semiconductor package of claim 12, wherein the first metal includes copper, the second metal includes titanium, and the oxide of a metal includes titanium oxide.

14. The semiconductor package of claim 12, wherein the electrically conductive portions include higher concentrations of the first metal at interfaces thereof with respective ones of the first electrically conductive layer and the second electrically conductive layer as compared with concentrations of the first metal at a distance from the interfaces within the electrically conductive portions.

15. An integrated circuit (IC) device assembly including:
a printed circuit board; and
a plurality of integrated circuit components coupled to the printed circuit board, individual ones of the integrated circuit components including one or more semiconductor packages, individual ones of the semiconductor packages including a microelectronic assembly:
a first microelectronic structure including a first substrate, a first dielectric layer disposed on the first substrate and defining openings therein, and a first electrically conductive layer including first electrically conductive structures in the openings of the first dielectric layer;
a second microelectronic structure including a second substrate, a second dielectric layer disposed on the second substrate and defining openings therein, and a second electrically conductive layer including second electrically conductive structures in the openings of the second dielectric layer; and
an interface layer between the first microelectronic structure and the second microelectronic structure, the interface layer being substantially planar and having a top surface substantially parallel to and underlying a bottom surface of the first microelectronic structure, and a bottom surface substantially parallel to and overlying a top surface of the second microelectronic structure, the interface layer including dielectric portions coextensive with the first dielectric layer and the second dielectric layer, and electrically conductive portions coextensive with the first electrically conductive structures and the second electrically conductive structures, wherein the dielectric portions include an oxide of a metal, and the electrically conductive portions include the metal.

16. The IC device assembly of claim 15, wherein the metal is a second metal, the first electrically conductive layer and the second electrically conductive layer including a first metal different from the second metal.

17. The IC device assembly of claim 16, wherein the first metal includes copper, the second metal includes titanium, and the oxide of a metal includes titanium oxide.

18. The IC device assembly of claim 16, wherein the electrically conductive portions include higher concentrations of the first metal at interfaces thereof with respective ones of the first electrically conductive layer and the second electrically conductive layer as compared with concentrations of the first metal at a distance from the interfaces within the electrically conductive portions.

19. A method to form a microelectronic assembly of a semiconductor package, the method including:

providing a first microelectronic structure including a first substrate, a first dielectric layer disposed on the first substrate and defining openings therein, and a first electrically conductive layer including first electrically conductive structures in the openings of the first dielectric layer;

providing a second microelectronic structure including a second substrate, a second dielectric layer disposed on the second substrate and defining openings therein, and a second electrically conductive layer including second electrically conductive structures in the openings of the second dielectric layer;

depositing a first metal layer on a bonding surface of the first microelectronic structure and a second metal layer on a bonding surface of the second microelectronic structure; and after depositing, bonding the first metal layer to the second metal layer to form an interface layer therefrom including dielectric portions coextensive with the first dielectric layer and the second dielectric layer, and electrically conductive portions coextensive with the first electrically conductive structures and the second electrically conductive structures, wherein the dielectric portions include an oxide of a metal of the first metal layer and of the second metal layer, and the electrically conductive portions include the metal, wherein the interface layer is substantially planar and has a top surface substantially parallel to and underlying a bottom surface of the first microelectronic structure, and a bottom surface substantially parallel to and overlying a top surface of the second microelectronic structure.

20. The method of claim 19, wherein bonding includes atomic diffusion bonding and annealing.

21. The method of claim 20, wherein depositing and atomic diffusion bonding occur in an ultra-high vacuum environment.

22. The method of claim 19, wherein each of the first metal layer and the second metal layer has a thickness between about 1 nm and about 2 nm.

23. The method of claim 20, wherein the annealing occurs at a temperature less than about 300 degrees Centigrade.

24. The method of claim 20, wherein the depositing includes sputtering the metal onto the bonding surface of each of the first microelectronic structure and the second microelectronic structure.

25. The method of claim 19, wherein the metal includes titanium, the first electrically conductive layer and the second electrically conductive layer including copper, and the oxide of a metal including titanium oxide.

* * * * *